United States Patent
Park et al.

(10) Patent No.: US 8,030,204 B2
(45) Date of Patent: Oct. 4, 2011

(54) SEMICONDUCTOR DEVICE AND METHOD OF MANUFACTURING THE SAME

(75) Inventors: Jin-Ho Park, Yongin-si (KR);
Gil-Heyun Choi, Seoul (KR);
Sang-Woo Lee, Seoul (KR); Ho-Ki Lee,
Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 489 days.

(21) Appl. No.: 12/217,932

(22) Filed: Jul. 10, 2008

(65) Prior Publication Data
US 2009/0014879 A1    Jan. 15, 2009

(30) Foreign Application Priority Data

Jul. 12, 2007 (KR) .................. 10-2007-0069887

(51) Int. Cl.
*H01L 21/4763* (2006.01)
(52) U.S. Cl. ............... 438/627; 438/628; 257/E21.584; 257/E23.161
(58) Field of Classification Search .................. 438/627, 438/628; 257/E21.584, E23.161
See application file for complete search history.

(56) References Cited

U.S. PATENT DOCUMENTS

| 6,368,967 B1 * | 4/2002 | Besser ........................... 438/687 |
| 6,689,684 B1 * | 2/2004 | You et al. ....................... 438/639 |
| 2008/0277788 A1 * | 11/2008 | Matsumori ................... 257/751 |

FOREIGN PATENT DOCUMENTS
JP      9-162288     6/1997

* cited by examiner

*Primary Examiner* — Matthew Landau
*Assistant Examiner* — Sonya McCall Shepard
(74) *Attorney, Agent, or Firm* — Onello & Mello, LLP

(57) ABSTRACT

In a method of forming a wiring structure for a semiconductor device, an insulation layer is formed on a semiconductor substrate on which a plurality of conductive structures is positioned. An upper surface of the insulation layer is planarized and spaces between the conductive structures are filled with the insulation layer. The insulation layer is partially removed from the substrate to form at least one opening through which the substrate is partially exposed. A residual metal layer is formed on a bottom and a lower portion of the sidewall of the at least one opening and a metal nitride layer is formed on the residual metal layer and an upper sidewall of the opening with a metal material. Accordingly, an upper portion of the barrier layer can be prevented from being removed in a planarization process for forming the metal plug.

21 Claims, 8 Drawing Sheets

SEMICONDUCTOR DEVICE AND METHOD OF MANUFACTURING THE SAME

CROSS-REFERENCE TO RELATED APPLICATIONS

This application claims priority under 35 U.S.C. §119 to Korean Patent Application No. 10-2007-0069887, filed on Jul. 12, 2007 in the Korean Intellectual Property Office (KIPO), the contents of which are herein incorporated by reference in their entirety.

BACKGROUND OF THE INVENTION

1. Field of the Invention

The present invention relates to a semiconductor device and a method of manufacturing the same, and more particularly, to a method of manufacturing a semiconductor device in which a barrier layer of a wiring structure has improved adhesion to an insulation layer, and a semiconductor device manufactured by the same method.

2. Description of the Related Art

Nowadays, as semiconductor devices are becoming highly integrated, sizes of source/drain regions and widths of gate electrodes and metal wiring in semiconductor devices are being rapidly reduced. Particularly, the small widths of the metal wiring can cause a rapid increase of an aspect ratio of a contact hole or a via hole, and thus there are difficulties in filling up the contact hole or the via hole by a conventional deposition process. For that reason, a planarization process has recently been introduced for formation of the metal wiring in a semiconductor device. According to such a process: a metal layer is formed on an insulation interlayer to a sufficient thickness to fill up the contact hole or the via hole by a conventional deposition process, and then the metal layer is planarized by the planarization process until a top surface of the insulation interlayer is exposed. As a result, only the metal layer remains in the contact hole or the via hole after the planarization process, thereby forming the metal wiring structure for a semiconductor device. Recently, there has been a strong tendency to form a metal plug as the contact plug in place of a conventional polysilicon plug. Particularly, when a metal plug is used as the via plug, the via plug generally comprises the same metal as the metal wiring, and thus there is an advantage in that the metal wiring and the via plug are formed in the same process.

When a plug or a wiring comprises a metal, a barrier layer along an inner surface of the contact hole or the via hole is usually required to prevent damage to underlying structures arranged under the insulation interlayer in a process for formation of the plug or the wiring. Tungsten (W) has been most widely used in a deposition process for forming the plug or the wiring to facilitate a process for a deposition process and due to its relatively low electrical resistance. However, tungsten has many disadvantages in a formation process of the plug or the wiring in that a tungsten layer can have difficulty in adhering to an oxide layer and source gases in a deposition process for the plug or the wiring can cause damage to the inner surface of the contact hole or the via hole.

In order to overcome the above disadvantages of the tungsten plug or the tungsten wiring, the barrier layer usually includes a glue layer along the inner surface of the contact hole or the via hole and an anti-diffusion layer on the glue layer. The anti-diffusion layer on the glue layer can prevent diffusion of the source gases, such as fluorine (F) ions and the glue layer on the inner surface of the hole can reduce contact resistance of the plug or wiring in the contact hole or the via hole.

The anti-diffusion layer on the glue layer is finally transformed into a portion of the plug or the wiring, and thus needs to satisfy requirements of high uniformity and low contact resistance. That is, the anti-diffusion layer is to be uniformly and evenly formed on the inner surface of a small space, such as the contact hole or the via hole, and is to be formed to have as small a thickness as possible to minimize the contact electrical resistance between the anti-diffusion layer and the metal plug. For the above requirements, a tungsten layer is usually used as the glue layer, and a tungsten nitride (WN) layer is frequently used as the anti-diffusion layer.

The contact hole or the via hole is formed in the insulation interlayer that usually comprises an oxide, and the barrier is formed on the inner surface of the contact hole or the via hole in such a configuration that a first tungsten layer is formed on the inner surface of the hole and a tungsten nitride layer is formed on the first tungsten layer. Then, a second tungsten layer is formed on the barrier layer to a thickness sufficient to fill up the hole, and a planarization process is performed on the second tungsten layer until a top surface of the insulation interlayer is exposed. Accordingly, only the second tungsten layer remains in the contact hole or the via hole in which the barrier layer is formed, thereby forming the contact plug or the metal wiring in the contact plug or the via hole.

However, the above conventional process for forming the contact plug and the metal wiring has a problem in that the first tungsten layer is removed from the insulation interlayer simultaneously with the second tungsten layer in the planarization process. Therefore, there is a problem in that the contact hole or the via hole may not be sufficiently filled with the plug and the plug may be spaced apart from the inner surface of the hole by a distance.

FIGS. 1A to 1D are scanning electron microscope (SEM) pictures showing a wafer on which a plug structure is formed through a conventional process, as described above. FIGS. 1A and 1B are SEM pictures showing a peripheral portion of the wafer including the plug structure, and FIGS. 1C and 1D are SEM pictures showing a front face of the wafer including the plug structure. FIGS. 1A and 1C are SEM pictures showing a contact plug on the wafer and FIGS. 1B and 1D are SEM pictures showing a metal wiring on the wafer.

Referring to FIGS. 1A to 1D, a bright portion is detected around the contact plug and the metal wiring, which indicates the contact hole and the via hole are not completely filled with the plug structure and the plug structure is spaced apart from the inner surface of the contact hole and the via hole. For that reason, the bright portion around the contact plug and the metal wiring is called a defect area D. The first tungsten layer is removed from the insulation interlayer at an upper portion of the contact hole or the via hole in the planarization process to the second tungsten layer for forming the plug structure, so that the plug structure is spaced apart from an upper portion of the inner surface of the hole by a gap distance corresponding to a thickness of the first tungsten layer. Therefore, the hole is not completely filled with the plug structure, and a void is generated between the plug structure and the upper portion of the inner surface of the hole. The void between the plug structure and the upper portion of the inner surface of the hole is represented as the bright portion in the above SEM pictures which is designated as the defective area D. The defective area D is also detected between a metal wiring and an upper portion of a trench.

In order to determine whether processing defects in the defective area D are caused by the loss of the first tungsten layer or the loss of the tungsten nitride layer as well as the first tungsten layer, a sample metal wiring is formed in such a configuration so that the inner surface of the via hole is coated by only the tungsten nitride layer and the sample metal layer is measured by an SEM device.

FIG. 2A is an SEM picture showing a metal wiring of a first sample wafer in which a barrier layer for the metal wiring only includes a tungsten nitride layer, and FIG. 2B is an SEM picture showing a metal wiring of a second sample wafer in which a barrier layer for the metal wiring includes a tungsten layer and a tungsten nitride layer.

As shown in FIG. 2A, the same defective area D as shown in FIGS. 1A to 1D was not measured in case where only the tungsten nitride layer was coated on the inner surface of the via hole as the barrier layer of the metal wiring. In contrast, when the first tungsten layer was coated on the inner surface of the via hole, the defective area D was measured, as shown in FIG. 2B. Accordingly, FIGS. 2A and 2B indicate that the first tungsten layer is only removed from the insulation interlayer in the planarization process for forming the contact plug or the metal wiring, and the tungsten nitride layer has a sufficient etch resistance in the above planarization process.

However, the electrical resistance of the tungsten nitride layer functioning as the anti-diffusion layer is much greater than that of the second tungsten layer functioning as the metal wiring, so that replacement of the first tungsten layer by the tungsten nitride layer rapidly increases the electrical resistance of the contact plug or the metal wiring. Particularly, when the first tungsten layer is removed from a bottom of the contact hole or the via hole at which the plug structure makes contact with the silicon substrate, the contact resistance between the silicon substrate and the contact plug can be significantly increased, thereby causing electrical shorts and device failures.

Accordingly, there is still a need for an improved wiring structure for preventing the first tungsten layer from being removed from the substrate at an upper portion of the contact hole when the first tungsten layer still remains at the bottom of the contact hole.

SUMMARY OF THE INVENTION

According to the present invention there is provided a method of manufacturing a semiconductor device for preventing a barrier layer of a metal wiring structure from being removed from an insulation layer at an upper portion of a contact hole in a planarization process for forming a plug of the metal wiring.

Also according to the present invention, there is provided a semiconductor device having no gap between an insulation layer and a plug of a metal wiring structure.

According to an aspect of the present invention, there is provided a method of manufacturing a semiconductor device. The method includes forming an insulating layer on a semiconductor substrate having various conductive structures, and planarizing the insulation layer. Portions of the insulation layer are removed from the substrate to form at least one opening through which the substrate is partially exposed. A barrier layer is formed on a sidewall and bottom of the at least one opening. The barrier layer includes a residual metal layer formed on the bottom and a lower portion of the sidewall of the at least one opening and a metal nitride layer formed on the residual metal layer and an upper sidewall of the at least one opening. A metal plug is formed in the at least one opening by filling up the at least one opening with a metal material.

The insulation layer can be formed by a chemical vapor deposition (CVD) process using tetraethoxysilane (Si(OC2H5)4) gas and one of an oxygen (O2) gas and an ozone (O3) gas as a source gas.

The CVD process can include a plasma-enhanced CVD (PECVD) process or a high-density plasma CVD (HDP-CVD) process.

A mask pattern can be formed on the insulation layer in such a configuration that portions of the insulation layer corresponding to the at least one opening are exposed through the mask pattern. Then, a dry etching process can be performed using the mask pattern as an etching mask, thereby forming the at least one opening in the insulation layer.

The barrier layer can be formed as follows. A metal layer can be formed on the sidewall and bottom of the at least one opening and on the upper surface of the insulation layer. The metal layer can comprise a first conductive metal. The residual metal layer can be formed on the bottom and the lower portion of the sidewall of the at least one opening by partially removing the metal layer from the upper surface of the insulation layer and the upper portion of the sidewall of the at least one opening. The metal nitride layer can be formed on the upper surface of the insulation layer, on the upper portion of the sidewall of the opening, and on a surface of the residual metal layer. The metal nitride layer can comprise a second conductive metal.

The metal layer can be formed by an atomic layer deposition (ALD) process, as follows. First reaction gases including the first conductive metal are provided into a process chamber in which the substrate including the insulation layer and the at least one opening is positioned, so that a portion of the first reaction gases is chemisorbed onto the sidewall and bottom of the opening and onto the upper surface of the insulation layer. Non-chemisorbed first reaction gases, which are not chemisorbed onto the sidewall and bottom of the at least one opening and onto the upper surface of the insulation layer, are purged or discharged out of the process chamber by providing a purge gas into the process chamber. The first conductive metal is deposited onto the sidewall and bottom of the at least one opening and onto the upper surface of the insulation layer by providing second reaction gases into the process chamber.

The first reaction gases can include at least one material selected from a group consisting of WF6, WCl5, WBr6, WCo6, W(C2H2)6, W(PF3)6, W(allyl)4, (C2H5)WH2, [CH3(C5H4)2]2WH2, (C5H5)W(Co)3(CH3), W(butadiene)3, W(methyl vinyl ketone)3, (C5H5)HW(Co)3, (C7H8)W(Co)3 and combinations thereof, and the second reaction gases can include at least one material selected from a group consisting of H2, Si2H6, B2H6, PH3, SiH4 and combinations thereof.

The purge gas can include at least one material selected form a group consisting of helium (He), neon (Ne), argon (Ar), xenon (Xe) and nitrogen (N2).

The metal layer can be formed on the sidewall and bottom of the opening and on the upper surface of the insulation layer to a thickness in a range of about 5 Å to about 200 Å.

The residual metal layer can be formed by a plasma etching process, as follows. A plasma is generated in a process chamber in which the substrate including the insulation layer and the metal layer is positioned, and variable bias power is applied to the process chamber in such a manner that the etching plasma is accelerated in a direction of the upper surface of the insulation layer and of the upper portion of the sidewall of the at least one opening at a higher rate than in a direction of the lower portion of the sidewall and the bottom of the at least one opening. The metal layer is partially removed from the upper portion of the sidewall of the at least one opening and from the upper surface of the insulation layer by the etching plasma.

Generating the plasma can include providing a source gas into the process chamber and applying source power to the process chamber, thereby transforming the source gas into the plasma.

Generating the plasma can be performed at an internal pressure of the process chamber in a range of about 0.005 Torr to about 50 Torr and source power in a range of about 10 W to about 3,000 W.

Radio frequency (RF) bias power of about 80 W to about 120 W can be applied to the process chamber as the variable bias power.

The source gas for generating the plasma can include an etching source gas for etching the metal layer and a polymer gas for controlling an etching rate of the plasma relative to the metal layer.

The etching source gas can include one of chlorine (Cl2) gas and tetrafluoromethane (CF4) gas and the polymer gas can include one of trifluoromethane (CHF3) gas and boron trichloride (BCl3).

The metal nitride layer can be formed by an ALD process, as follows. First reaction gases including the second conductive metal are provided into a process chamber in which the substrate including the insulation layer and the residual metal layer is positioned, so that a portion of the first reaction gases is chemisorbed onto the upper portion of the sidewall, onto the upper surface of the insulation layer and onto a surface of the residual metal layer. Non-chemisorbed first reaction gases, which are not chemisorbed onto the upper portion of the sidewall, onto the upper surface of the insulation layer and onto the surface of the residual metal layer, are purged or discharged out of the process chamber by providing a first purge gas into the process chamber. The second conductive metal can be deposited onto the upper portion of the sidewall, onto the upper surface of the insulation layer, and onto the surface of the residual metal layer by providing second reaction gases into the process chamber, thereby forming a temporary metal layer on the upper portion of the sidewall, on the upper surface of the insulation layer, and on the surface of the residual metal layer. Non-chemisorbed second reaction gases, which are not chemisorbed onto the upper portion of the sidewall, onto the upper surface of the insulation layer and onto the surface of the residual metal layer, and byproducts caused by a chemical reaction of the first and second reaction gases are purged or discharged out of the process chamber by providing a second purge gas into the process chamber. The temporary metal layer is nitrated by providing third reaction gases including nitrogen (N).

The first reaction gases can include at least one material selected from a group consisting of $WF_6$, $WCl_5$, $WBr_6$, $WCo_6$, $W(C_2H_2)_6$, $W(PF_3)_6$, $W(allyl)_4$, $(C_2H_5)WH_2$, $[CH_3(C_5H_4)_2]_2WH_2$, $(C_5H_5)W(Co)_3(CH_3)$, W(butadiene)3, W(methyl vinyl ketone)3, $(C_5H_5)HW(Co)_3$, $(C_7H_8)W(Co)_3$ and combinations thereof. The second reaction gases can include at least one material selected from a group consisting of $H_2$, $Si_2H_6$, $B_2H_6$, $PH_3$, $SiH_4$ and combinations thereof, and the third reaction gases can include one of nitrogen (N2) gas and ammonium (NH3) gas.

The temporary metal layer can be formed to a thickness in a range of about 20 Å to about 400 Å.

The metal layer, the residual metal layer, and the metal nitride layer can be formed in the same process chamber.

In an example embodiment, the metal plug can be formed as follows. A third conductive metal is deposited onto a surface of the metal nitride layer to a thickness sufficient to fill up the at least one opening, thereby forming a plug metal layer on the metal nitride layer. A planarization process is performed on the plug metal layer until the upper surface of the insulation layer is exposed, so that the plug metal layer and the metal nitride layer under the plug metal layer are partially removed from the upper surface of the insulation layer and remain in the opening.

The third conductive metal can include tungsten (W).

The planarization process can include a chemical mechanical polishing (CMP) process.

After forming the metal plug, the method can comprise forming an insulation interlayer on the insulation layer and on the metal plug, and forming a via hole passing through the insulation interlayer by partially removing the insulation interlayer. The metal plug can be exposed through the via hole. A conductive line can be formed in such a manner that the via hole is filled up with the conductive line and the metal plug is electrically connected with the conductive line.

The via hole can be formed by a damascene process and the conductive line can comprise one of tungsten, aluminum (Al) and copper (Cu).

According to another aspect of the present invention, there is provided a semiconductor device having no gap between an insulation layer and a plug of a metal wiring structure. The semiconductor device includes a semiconductor substrate including various conductive structures, an insulation layer on the substrate to cover the conductive structures so that spaces between the conductive structures are filled with the insulation layer and an upper surface of the insulation layer is planarized, at least one opening is formed through the insulation layer and partially exposing the substrate and a tungsten plug is formed in the at least one opening. A barrier layer is interposed between the tungsten plug and the insulation layer, wherein a lower portion of the barrier layer adjacent to the substrate includes a tungsten layer and a tungsten nitride layer and an upper portion of the barrier layer adjacent to the insulation layer includes a tungsten nitride layer. An insulation interlayer on the tungsten plug and the insulation layer, the insulation interlayer including a via hole through which the tungsten plug is exposed. And a conductive line fills up the via hole and is electrically connected to the tungsten plug.

The conductive structures on the substrate can include a string selection transistor, a number of cell selection transistors, and a ground selection transistor that are positioned in an active region defined by a device isolation layer and extends in a first direction on the substrate, so that a number of the string selection transistors, a number of the cell selection transistors, and a number of the ground selection transistors that are arranged in a second direction perpendicular to the first direction include a string selection line, a word line, and a ground selection line of a flash memory device, respectively.

The conductive line can comprise copper.

The structure on the substrate can include a unit transistor of a dynamic random access memory (DRAM) device, the unit transistor of the DRAM device having a gate line that is defined by a device isolation layer and extends along a first direction on the substrate and source and drain regions formed at surface portions of the substrate adjacent to the gate line by an ion implantation process.

According to example embodiments in accordance with the present invention, an upper portion of the barrier layer, which can be interposed between the insulation interlayer and the contact plug, can comprise metal nitride, and a lower portion of the barrier layer can comprise a metal layer and a metal nitride layer. Therefore, the upper portion of the barrier layer may not be removed from the substrate in the planarization process for forming the contact plug while the contact plug has a sufficiently low contact resistance.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DESCRIPTION OF THE EMBODIMENTS

Figure 1A:
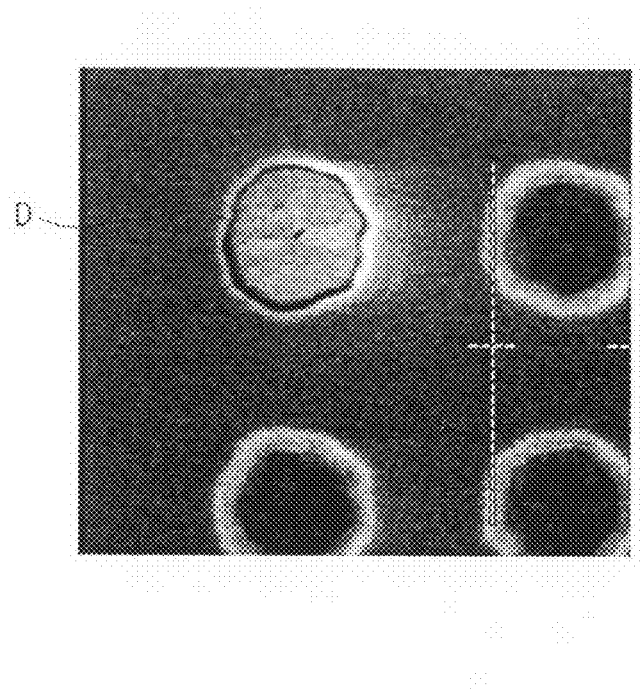
FIGS. 1A to 1D are scanning electron microscope (SEM) pictures showing a wafer on which a plug structure is formed through a conventional process.
Figure 1B:
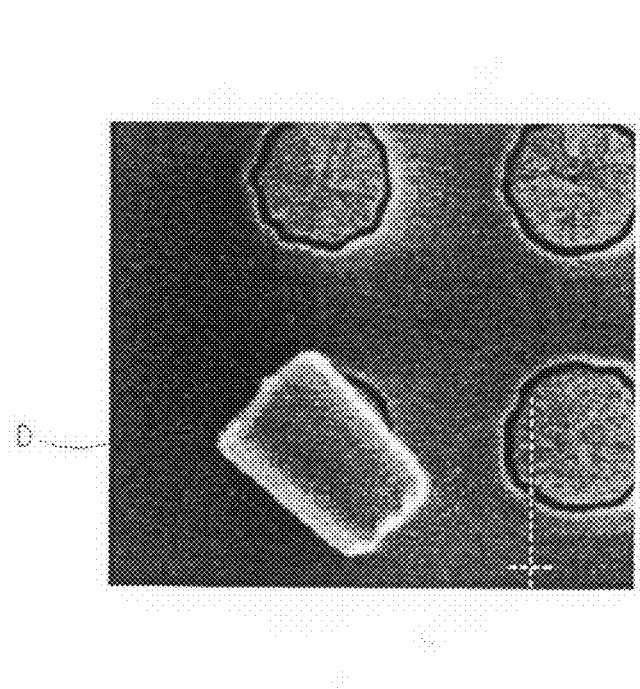
Figure 1C:
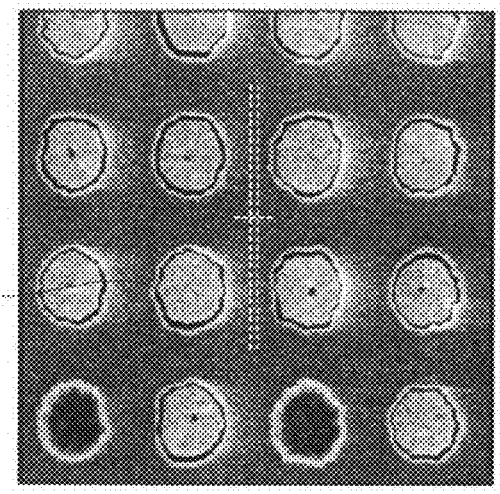
Figure 1D:
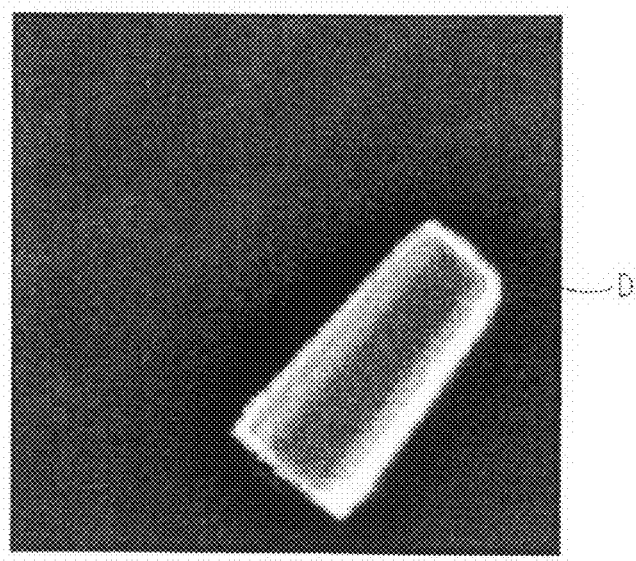
Figure 2A:
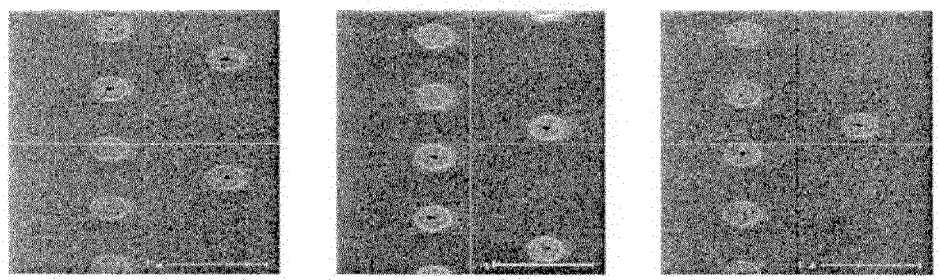
FIG. 2A is an SEM picture showing a metal wiring of a first sample wafer in which a barrier layer for the metal wiring only includes a tungsten nitride layer, in accordance with the conventional process.
Figure 2B:
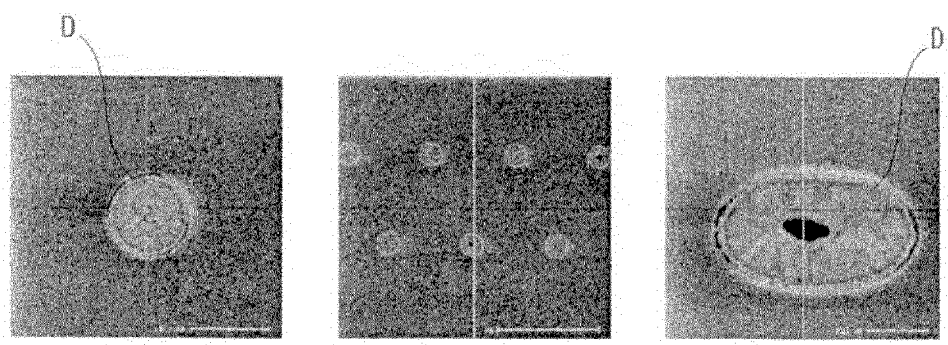
FIG. 2B is an SEM picture showing a metal wiring of a second sample wafer in which a barrier layer for the metal wiring includes a tungsten layer and a tungsten nitride layer, in accordance with the conventional process.

Embodiments in accordance with aspects of the present invention are described more fully hereinafter with reference to the accompanying drawings. This invention can, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIGS. 3A to 3H are cross-sectional views illustrating an example embodiment of a method of forming a wiring structure for a semiconductor device in accordance with an aspect of the present invention.

Figure 3A:
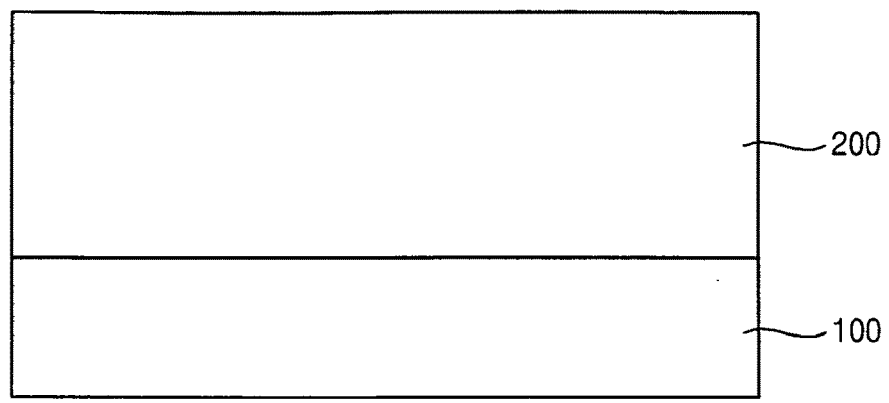
FIGS. 3A to 3H are cross-sectional views illustrating an example embodiment of a method of forming a wiring structure for a semiconductor device in accordance with an aspect of the present invention.

Referring to FIG. 3A, various conductive structures (not shown) are formed on a substrate 100 and an insulation layer 200 is formed on the substrate 100 to a sufficient thickness to fill up gap spaces between neighboring conductive structures. A top surface of the insulation layer 200 can be planarized by a planarization process, such as a chemical mechanical polishing (CMP) process, for example.

In an example embodiment, a device isolation layer (not shown) can be formed on a portion of the substrate 100, to thereby define an active region surrounded by the device isolation layer. For example, a gate electrode and source/drain electrodes for a memory device or a non-memory device can be formed on the active region of the substrate 100. The memory device can include a volatile device and a non-volatile device, as would be known to one of ordinary skill in the art. Volatile memory devices, such as dynamic random access memory (DRAM) devices and static random access memory (SRAM) devices, have relatively high input/output (I/O) speeds, and lose data stored therein when power is shut off. In contrast, non-volatile memory devices, such as read-only memory (ROM) devices, are able to maintain data stored therein even when power is shut off.

In an example embodiment, the insulation layer 200 can include a first layer (not shown) that is formed on the substrate and electrically insulates neighboring conductive structures from each other and a second layer (not shown) that is formed on the first layer and fills up the gap spaces between the neighboring conductive structures. For example, the second layer can be planarized by a planarization process to a thickness from a top surface of the first layer, so that a top surface of the insulation layer 200 can be formed to be even therewith. For example, the second layer can include an insulation interlayer for a DRAM memory device in which a contact pad is located and an insulation interlayer for a flash memory device in which a common source line is located.

In an example embodiment, the insulation layer 200 can include an oxide layer. Examples of the oxide layer can comprise borophosphosilicate glass (BPSG), phosphosilicate glass (PSG), fluorosilicate glass (FSG), plasma-enhanced tetraethyl orthosilicate (PE-TEOS), undoped silicate glass (USG), etc. These can be used alone or in combinations thereof. In the present embodiment, the insulation layer 200 can comprise plasma-enhanced tetraethyl orthosilicate (PE-TEOS). Particularly, the insulation layer 200 can be formed on the substrate by a plasma-enhanced chemical vapor deposition (PECVD) process using tetraethoxysilane (Si(OC2H5)4) gas and one of oxygen gas and ozone gas as a source gas. Otherwise, the first layer can comprise an oxide deposited onto the substrate 100 including the conductive structures by a high-density plasma chemical vapor deposition (HDP-CVD) process or an undoped silicate glass that can have superior gap-fill characteristics, and the second layer can comprise tetraethyl orthosilicate (TEOS) deposited onto the first layer by a PECVD process.

Figure 3B:
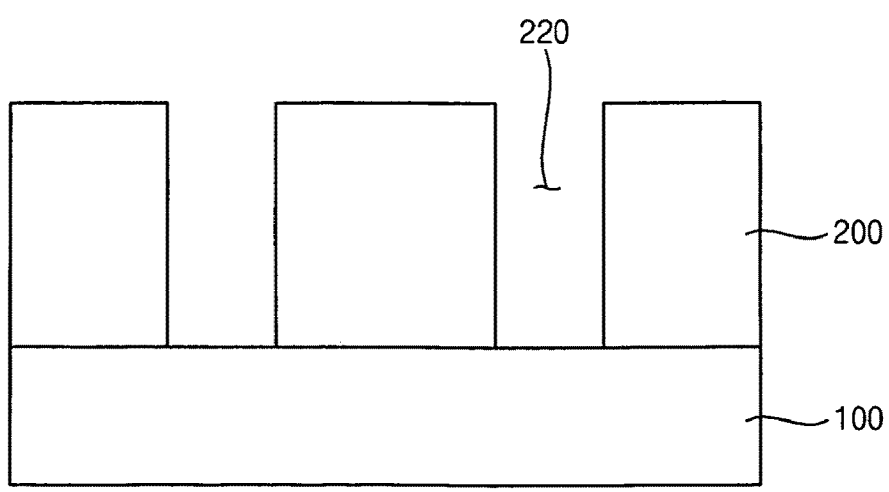

Referring to FIG. 3B, the insulation layer 200 can be partially removed from the substrate 100 to thereby form an opening 220 through which the substrate 100 is partially exposed.

In an example embodiment, the opening is formed using a mask pattern (not shown) formed on the insulation layer 200. The mask pattern is formed in such a configuration that portions of the insulation layer 200 corresponding to the opening 220 is exposed through the mask pattern. An etching process can be performed on the insulation layer 200 using the mask pattern as an etching mask, to thereby form the opening 220 through which the substrate 100 is partially exposed. For example, the etching process can include a dry etching process using plasma and source/drain regions of a DRAM device, a source region of a flash memory device, i.e., a string selection line region and a drain region of a flash memory device, i.e., a ground selection line region. Then, a native oxide layer can be removed from the opening. The native oxide layer can be removed from the substrate simultaneously with the insulation layer 200 in the etching process.

Then, a barrier layer is formed on a sidewall and a bottom of the opening 220 and on a top surface of the insulation layer 200. Particularly, a lower barrier layer, which is formed at a lower portion of the opening 220, can include a metal layer and a metal nitride layer and an upper barrier layer, which is formed at an upper portion of the opening 220, can include a nitride layer. In the present embodiment, the opening 220 can include a contact hole in which a conductive plug is formed and a via hole in which a wiring structure, such as a via plug and a metal wiring, is formed.

Figure 3C:
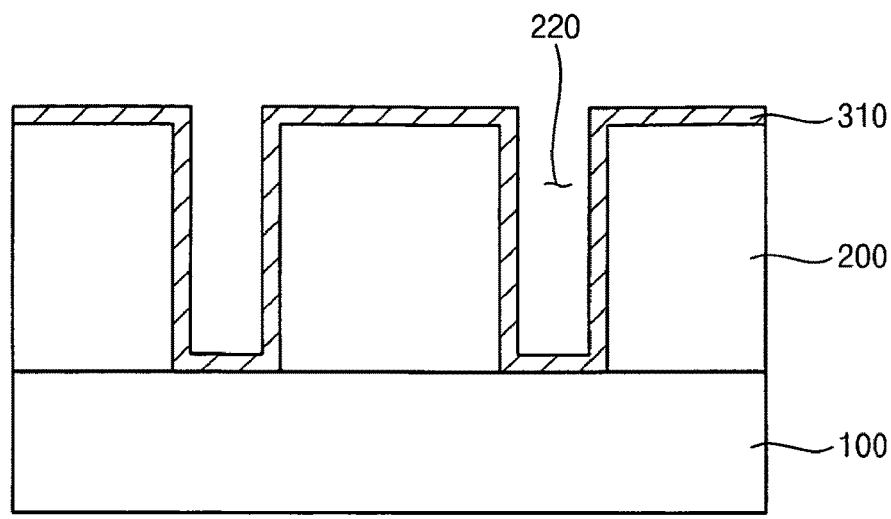

Referring to FIG. 3C, a metal layer 310 is formed on the sidewall and the bottom of the opening 220 and on the top surface of the insulation layer 200. In an example embodiment, the metal layer can be formed by an ionized metal plasma process using an ionized metal or by an atomic layer deposition (ALD) process. In the present embodiment, the ALD process can be performed on the substrate 100 including the opening 220, so that the metal layer 310 has as small a thickness as possible.

In an example embodiment, the substrate 100 including the opening 220 is loaded into a process chamber (not shown) for an ALD process, and first reaction gases including first conductive materials are provided into the process chamber. Some of the first reaction gases are chemisorbed onto the sidewall and the bottom of the opening 220 and onto the top surface of the insulation layer 200, while the rest of the first reaction gases float in the process chamber. Then, a first purge gas including inert gas can be provided into the process chamber, and thus non-chemisorbed first reaction gases are purged out of the process chamber. Second reaction gases including reductants are provided into the process chamber. The reductants are chemically reacted with the chemisorbed first reaction gases except for the first conductive materials, to thereby generate chemical products on the sidewall and bottom of the opening 220 and on the top surface of the insulation layer 220.

Then, the chemical products can float within the space of the process chamber, so that only the first conductive materials are deposited onto the sidewall and bottom of the opening 220 and on the top surface of the insulation layer 220. A second purge gas including inert gas can be provided into the process chamber, and thus residuals of the second reaction gases that are not chemically reacted with the first reaction gases and the chemical products in the space of the process chamber are discharged from the process chamber. The metal layer 310 is formed to a unit thickness on the sidewall and bottom of the opening 220 and on the top surface of the insulation layer 220 through a unit cycle of the unit steps of providing the first reaction gases, providing the first purge gases, providing the second reaction gases and providing the second purge gases in an ALD process. The thickness of the metal layer 310 is varied in accordance with a repetition number of the unit cycle of the ALD process.

The first conductive material can comprise tungsten (W) or titanium (Ti). Examples of the first reaction gases including tungsten can comprise WF6, WCl5, WBr6, WCo6, W(C2H2)6, W(PF3)6, W(allyl)4, (C2H5)WH2, [CH3(C5H4)2]2WH2, (C5H5)W(Co)3(CH3), W(butadiene)3, W(methyl vinyl ketone)3, (C5H5)HW(Co)3, (C7H8)W(Co)3, etc. These can be used alone or in combinations thereof. Examples of the second reaction gases can comprise H2, Si2H6, B2H6, PH3, SiH4, etc. These may be also used alone or in combinations thereof. In addition, the inert gas in the first and second purge gases can comprise one of He, Ne, Ar, Xe, and N2. In the present embodiment, the ALD process for forming the metal layer can be performed at a pressure of about 10 Torr to about 350 Torr and at a temperature in a range of about 250° C. to about 550° C., and the metal layer 310 is formed on the sidewall and bottom of the opening 220 and on the top surface of the insulation layer 220 to a thickness in a range of about 5 Å to about 200 Å.

The metal layer is formed to have as small a thickness as possible, to thereby reduce the contact resistance of the metal layer 310, as much as possible. While the above example embodiment discloses an ALD process for reducing the thickness of the metal layer to be as small as possible, any other deposition process known to one of ordinary skill in the art can also be utilized in place of or in conjunction with the ALD process only if the metal layer can be formed to as small a thickness as possible. For example, a pulsed layer nucleation (PNL) process or a cyclic CVD process can be utilized in place of or in conjunction with the ALD process.

Figure 3D:
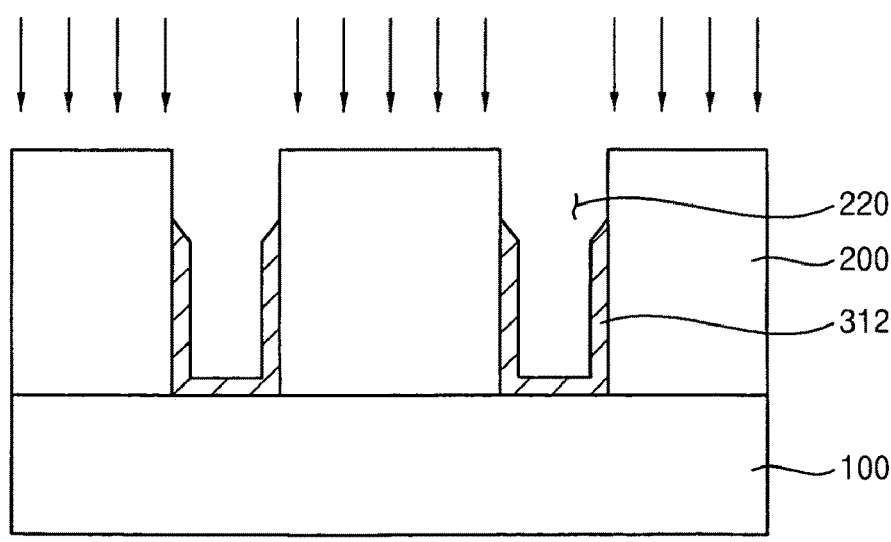

Referring to FIG. 3D, an etching process can be performed on the metal layer 310 in such a configuration that the metal layer 310 can be removed from an upper portion of the sidewall of the opening 220 and from the top surface of the insulation layer 200 and can remain on a lower portion of the sidewall and the bottom of the opening 220. That is, the metal layer 310 is changed into a residual metal layer 312 that remains on the lower portion of the sidewall and the bottom of the opening 220.

In an example embodiment, a plasma etching process can be performed at the upper portion and the lower portion of the opening 220 at different plasma intensity, respectively, to thereby form the residual metal layer 312 at the lower portion of the opening 220.

In an example embodiment, the etching plasma is generated at an upper portion of a process chamber in which the substrate 100 including the metal layer 310 is positioned, and application of the etching plasma is much more accelerated onto the top surface of the insulation layer 200 rather than onto the lower portion of the opening 220. For example, acceleration of the plasma is a function of an applied bias voltage. And application of the bias voltage for accelerating the plasma is significantly greater under a first portion of the substrate 100 on which the insulation layer 200 is positioned as compared to under a second portion of the substrate of which the surface is exposed through the opening 220. Therefore, the plasma at an upper portion over the metal layer 310 is accelerated onto the surface of the insulation layer 200 much more than onto the surface of the substrate 100 in the opening 220. That is, the plasma over the metal layer 310 can be controlled to be deflected to the surface of the insulation layer 200 rather than to the bottom of the opening 220. In the present embodiment, a variable bias can be applied under the substrate 100 and the bias voltage of the variable bias can be varied in accordance with a shape of the insulation layer 200. That is, the variable bias can be applied as a pulse wave in which the bias voltage is periodically reduced under each of the openings 220, and thus most of the etching plasma is accelerated onto the insulation layer 200 rather than onto the bottom of the opening 220.

Therefore, the metal layer 310 can be removed from the surface of the insulation layer 200 and the upper sidewall of the opening 220 that is adjacent to the surface of the insulation layer 200, while the metal layer 310 still remains on the lower sidewall and the bottom of the opening 220 unetched by the etching plasma. That is, the metal layer 310 can be removed from the upper portion of the opening and the insulation layer 200 by the differential plasma etching process, to thereby be transformed into the residual metal layer 312 on the lower sidewall and bottom of the opening 220.

In an example embodiment, the process chamber includes a closed space for performing the etching process and is evacuated to a substantially vacuum state. Then, source gases for the plasma etching process are supplied into the process chamber. A source power is applied to the source gases in the process chamber, and thus the etching plasma is generated at the upper portion of the process chamber. Radio frequency (RF) bias power is applied under the substrate 100 in such a manner that the etching plasma is accelerated onto the insulation layer 200, rather than onto the bottom of the opening 220. For example, the source gases can include etching gases for etching the metal layer 310 and polymer gases for controlling the etching rate of the metal layer by the etching gases. The etching gases can include at least one of chlorine (Cl2) gas and tetrafluoromethane (CF4) gas and the polymer gases can include at least one of trifluoromethane (CHF3) gas and boron trichloride (BCl3). In the present embodiment, the process chamber can be controlled to be under an internal pressure in a range of about 0.005 Torr to about 50 Torr and the source power for generating the etching plasma can be controlled to be in a range of about 10 W to about 3,000 W. The RF bias power for accelerating the etching plasma can be controlled to be in a range of about 80 W to about 120 W.

In another example embodiment, the residual metal layer can be formed on the lower portion of the opening 220 using a mask pattern. The lower portion of the opening 220 can be covered with the mask pattern (not shown), while the upper portion of the opening 220 and the insulation layer 200 is not covered with the mask pattern. Therefore, the metal layer 310 on the surface of the insulation layer 200 and on the upper sidewall of the opening 220 is etched off by the etching plasma, while the metal layer 310 on the lower sidewall and the bottom of the opening 220 is protected from the etching plasma by the mask pattern and remains unetched. Thereafter, the mask pattern is removed from the substrate 100 and the metal layer 310 remains on the lower portion of the opening 220, to thereby from the residual metal layer 312 on the lower portion of the opening 220.

The plasma etching process for the metal layer 310 can be performed in the same process chamber as for the deposition process for the metal layer 310, or can be performed in a different process chamber in which the deposition process for forming the metal layer 310 is performed. When the etching process and the deposition process can be in different chambers, respectively, the substrate on which the metal layer is formed is transferred to the plasma process chamber from the deposition process chamber. Particularly, when the deposition process of the metal layer and the differential plasma etching process against the metal layer are performed in the same chamber, there is an advantage in that the deposition process and the plasma etching process can be performed without any vacuum break that can be caused by the chamber transfer between the etching chamber and the deposition chamber, which would thereby improve process efficiency in forming the wiring structure.

Figure 3E:
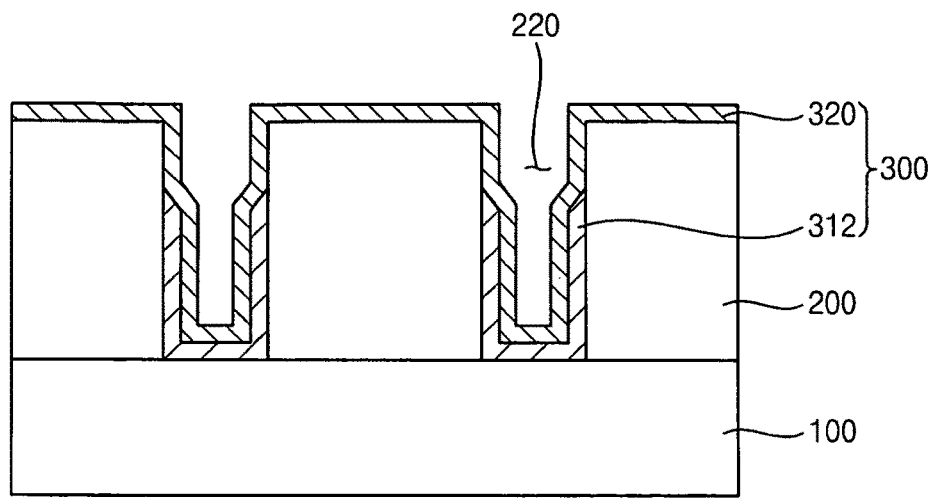

Referring to FIG. 3E, a metal nitride layer 320 is formed on the residual metal layer 312. The metal nitride layer 320 can include a second conductive material. In an example embodiment, the metal nitride layer 320 can be formed by an ALD process, to thereby accurately control the thickness thereof. However, any other ALD-like processes can be used in place of the ALD process if the thickness of the metal nitride layer 320 is accurately controlled. For example, suitable ALD-like processes can include a PNL process and a cyclic CVD process.

In an example embodiment, the substrate 100 with the residual metal layer 312 is loaded into a process chamber (not shown) for application of an ALD process, and first reaction gases including the second conductive materials are provided into the process chamber. Some of the first reaction gases are chemisorbed onto a surface of the residual metal layer 312, the upper sidewall of the opening 220 and the top surface of the insulation layer 200, and the rest of the first reaction gases float in the process chamber. Then, a first purge gas including an inert gas can be provided into the process chamber, and thus non-chemisorbed first reaction gases are purged out of the process chamber. Second reaction gases are provided into the process chamber and are chemically reacted with the chemisorbed first reaction gases except for the second conductive materials, to thereby generate chemical products on the residual metal layer 312, on the upper sidewall of the opening 220, and on the surface of the insulation layer 200. Then, the chemical products can float in the space of the process chamber, so that only the second conductive materials are deposited on the residual metal layer 312, on the upper sidewall of the opening 220, and on the surface of the insulation layer 200. Therefore, a temporary metal layer (not shown), which comprises second conductive materials, is formed on the residual metal layer 312, on the upper sidewall of the opening 220 and on the surface of the insulation layer 200. A second purge gas including inert gas can be provided into the process chamber, and thus residuals of the second reaction gases that are not chemically reacted with the first reaction gases and the chemical products in the space of the process chamber are discharged from the process chamber. Then, third reaction gases including nitrogen gas are provided into the process chamber, to thereby form the metal nitride layer 320 on the residual metal layer 312, on the upper sidewall of the opening 220, and on the surface of the insulation layer 200.

The second conductive material can comprise tungsten or titanium, as examples. When the second conductive material comprises tungsten, the first reaction gases can include one of WF6, WCl5, WBr6, WCo6, W(C2H2)6, W(PF3)6, W(allyl) 4, (C2H5)WH2, [CH3(C5H4)2]2WH2, (C5H5)W(Co)3 (CH3), W(butadiene)3, W(methyl vinyl ketone)3, (C5H5) HW(Co)3, (C7H8)W(Co)3, etc. These can be used alone or in combinations. Examples of the second reaction gases can comprise H2, Si2H6, B2H6, PH3, SiH4, etc. These can be also used alone or in combinations. The third gases can include nitrogen gas or ammonia gas. In the present embodiment, the ALD process for forming the metal nitride layer 320 can be performed at a pressure in a range of about 10 Torr to about 350 Torr and at a temperature in a range of about 250° C. to about 550° C., and the metal nitride layer 320 is formed on the residual metal layer 312 and the insulation layer 200 to a thickness in a range of about 20 Å to about 400 Å. Accordingly, the barrier layer 300 of the present example embodiment can include the residual metal layer 312 and the metal nitride layer 320. The residual layer 312 can reduce the contact resistance between the substrate 100 and a metal plug that is to be formed in the opening 220 in a subsequent process, and the metal nitride layer 320 can prevent metal materials of the metal plug from diffusing into the insulation layer 200 and into the substrate 100, thereby improving electrical characteristics of a wiring structure for a semiconductor device.

In an example embodiment, the metal nitride layer 320 can be formed in the same process chamber as used for the deposition process for the metal layer 310 or as used for the differential plasma etching process against the metal layer 310. Otherwise, the metal nitride layer 320, the residual metal layer 312, and the metal layer 310 can be formed in individual process chambers, respectively, that are different from one another.

In the present example embodiment, the metal layer 310, the residual metal layer 312, and the metal nitride layer 320 are formed in the same process chamber. For example, a first process for forming the metal layer 310, a second process for forming the residual metal layer 312, and a third process for forming the metal nitride layer 320 are sequentially formed in the same process chamber. Particularly, the process conditions for each of the processes can be independently set in the single process chamber and the source gases for each of the processes can be independently provided to the process chamber. Particularly, the single process chamber can include a number of process stations each of which is functionally separated from the others by an air curtain and the first, second, and third processes are performed at the process stations, respectively. Accordingly, the metal layer 310, the residual metal layer 312, and the metal nitride layer 320 can be formed in the same process chamber.

Figure 3F:
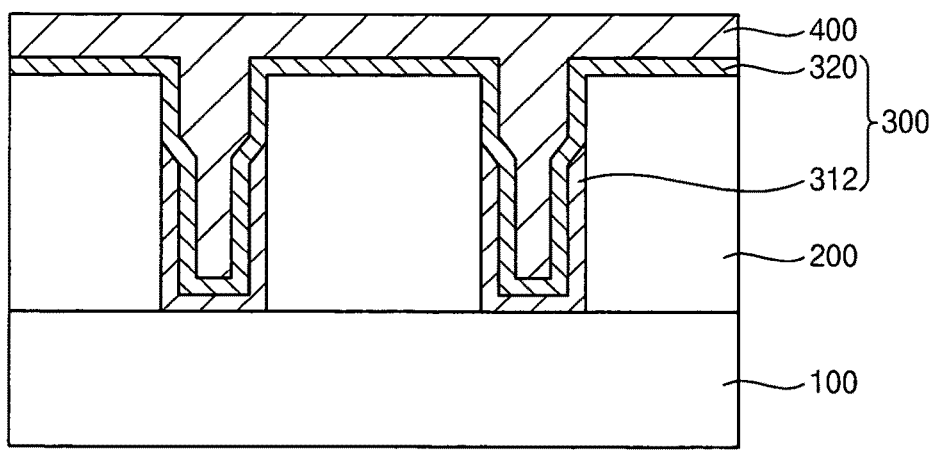

Referring to FIG. 3F, a conductive layer 400 can be formed on a resultant structure including the barrier layer 300 to a thickness sufficient to fill up the opening 220. For example, third conductive materials are deposited onto the metal nitride layer 320 by a CVD process to a thickness sufficient to fill up the opening 220. The third conductive material can include tungsten, for example.

Figure 3G:
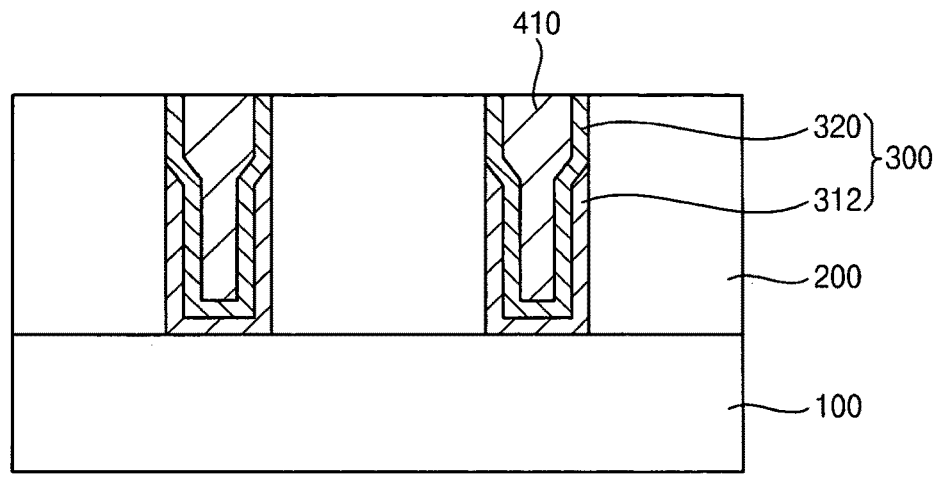

Referring to FIG. 3G, the conductive layer 400 and the barrier layer 300 are partially removed from the resultant structure by a planarization process, so that portions of the conductive layer 400 and the barrier layer 300 remain in the opening where the sidewall and bottom are covered with the barrier layer 300. As a result, a metal plug 410 is formed in the opening 220. In an example embodiment, the conductive layer 400 and the barrier layer 300 are planarized by a CMP process until the surface of the insulation layer 200 is exposed. Accordingly, the conductive layer 400 and the barrier layer only remain in the opening 220 in such a configuration that the barrier layer is formed on the sidewall and bottom of the opening 220 and the conductive layer 400 is enclosed by the barrier layer 300. That is, the conductive layer 400 is separated from the insulation layer 200 and the substrate 100 by the barrier layer 300 in the opening 220, thereby forming the metal plug 410 in the opening 220.

Accordingly, the metal nitride layer 320 on the upper sidewall of the opening 220 can be prevented from being removed in the CMP process due to better resistance against the CMP process than the conventional metal layer, so that the metal plug 410 can be sufficiently prevented from being spaced apart from the upper sidewall of the opening 220. That is, the void between the metal plug 410 and the insulation layer 200 can be sufficiently prevented by the metal nitride layer 320 on the upper sidewall of the opening 220.

Figure 3H:
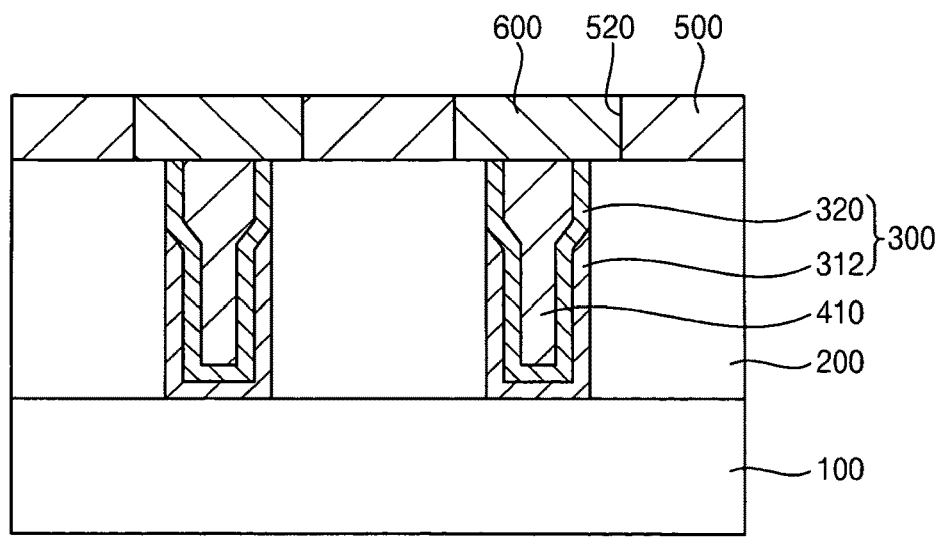

Referring to FIG. 3H, after formation of the metal plug 410, an insulation interlayer 500 can be formed on the insulation layer 200, the barrier layer 300 and the metal plug 410. Then, the insulation interlayer 500 can be partially removed by an etching process, to thereby form a via hole 520 through which the metal plug 410 is exposed. A conductive line 600 is formed in the via hole 520 and the metal plug 410 is electrically connected to the conductive line 600, to thereby form the wiring structure for a semiconductor device. In an example embodiment, the via hole 520 can be formed through a damascene process and the conductive line 600 can comprise one of tungsten, aluminum (Al) and copper (Cu).

According to an example embodiment, a metal layer for reducing the contact resistance between the metal plug and the substrate can be partially nitrated, so that the metal layer can be prevented from being removed from the insulation layer at an upper portion of the opening in a planarization process for forming the metal plug. Therefore, the metal plug 410 can be sufficiently prevented from being spaced apart from the insulation layer 500, thereby improving the electrical characteristics of the wiring structure of the semiconductor device.

Figure 4:
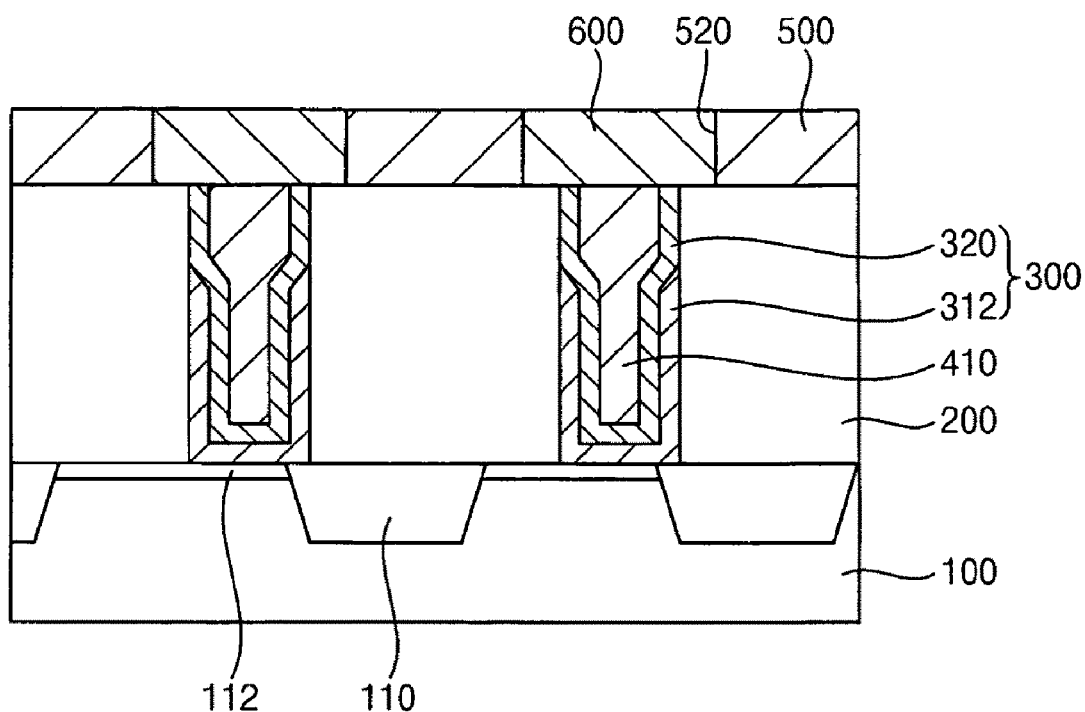
FIG. 4 is a cross sectional view illustrating an example embodiment of a wiring structure for a semiconductor device in accordance with an aspect of the present invention.

FIG. 4 is a cross sectional view illustrating an embodiment of a wiring structure for a semiconductor device in accordance with an aspect of the present invention. In particular, FIG. 4 is a cross sectional view illustrating an embodiment of a drain electrode of a DRAM device taken in parallel with a gate line of the DRAM device.

Referring to FIG. 4, the wiring structure 900 for a semiconductor device can include a semiconductor substrate 100 on which various conductive structures and an insulation layer 200 for filling up spaces between the adjacent conductive structures, a metal plug 410 penetrating through the insulation layer 200 and making contact with a portion of the substrate 100 and a conductive line 600 electrically connected to the metal plug 410. The insulation layer 200 has a substantially flattop surface.

In an example embodiment, the conductive structure on the substrate 100 can include a unit transistor of the DRAM device. The unit transistor of the DRAM device can include a gate line (not shown) that is defined by a device isolation layer 110 and extends along a first direction on the substrate 100 and a source region (not shown) and a drain region 112 formed at surface portions adjacent to the gate line by an ion implantation process. Although not shown in the accompanying figures, the conductive structures can include a string selection transistor, a number of cell selection transistors, and a ground selection transistor positioned in an active region of the substrate 100. The active region is defined by a device isolation layer and extends in a first direction on the substrate 100. A number of string selection transistors, a number of cell selection transistors, and a number of ground selection transistors that are arranged in a second direction perpendicular to the first direction can include a string selection line, a word line, and a ground selection line of a flash memory device, respectively.

The metal plug 410 can be electrically connected to the drain region 112 and can transfer electrical signals to the unit transistor of the DRAM device from the conductive line 600. In an example embodiment, the metal plug 410 can comprise tungsten having a low electrical resistance and good electrical conductivity, as an example. The conductive line 600 can comprise copper or aluminum, as examples.

An insulation interlayer 500 is positioned on the insulation layer 200 including the metal plug 410, and a via hole 520 is formed in the insulation interlayer 500. A barrier layer 300 can be interposed between the substrate 100 and the insulation layer 200, to thereby reduce the contact resistance between the metal plug 410 and the substrate 100 and prevent metal materials from the metal plug 410 from diffusing into the insulation layer 200 and into the substrate 100.

In an example embodiment, the barrier layer 300 can include a metal nitride layer 320 and a residual metal layer 312. The metal nitride layer 320 makes contact with the insulation layer 200. And the residual metal layer 312 is interposed between the metal nitride layer 320 and the insulation layer 200 and between the metal nitride layer 320 and the substrate 100. That is, an upper portion of the barrier layer 300 can comprise metal nitride, and a lower portion of the barrier layer 300 can comprise a composite of metal and metal nitride. For example, the residual metal layer 312 can comprise tungsten and the metal nitride layer 320 can comprise tungsten nitride (WN). That is, the upper portion of the barrier layer 300 can include a single layer of tungsten nitride and the lower portion of the barrier layer 300 can include a double layer of tungsten and tungsten nitride.

The metal nitride layer 320 can have a thickness in a range of about 20 Å to about 400 Å and can prevent the metal materials of the metal plug 410 from diffusing into the insulation layer 200 and the substrate 100. The residual metal layer 312 can have a relatively small thickness in a range of about 5 Å to about 200 Å and can reduce the contact resistance between the metal plug 410 and the substrate 100 to thereby improve contact reliability between the metal plug and the substrate 100.

The conductive line 600 can comprise conductive materials and can fill up the via hole 520 passing through the insulation interlayer 500. The metal plug 410 can be electrically connected to the conductive line 600 and can include a bit line of a semiconductor device. For example, the metal plug 410 can comprise tungsten and the conductive line 600 can comprise copper. Particularly, when the conductive line 600 comprises copper, the via hole 520 is formed through a damascene process, to thereby improve contact reliability between the metal plug 410 and the conductive line 600.

According to an example embodiment of the wiring structure, the upper portion of the barrier layer can comprise metal nitride having superior etch resistance against the planarization process for forming the metal plug, and thus the barrier layer can still remain at the upper portion of the opening after the planarization process for forming the metal plug, to thereby prevent voids or gaps between the metal plug and the insulation layer. That is, the metal plug 410 can be prevented from being spaced apart from the insulation layer, to thereby improve the electrical reliability of the wiring structure for a semiconductor device.

According to the example embodiments of the present invention, a barrier layer can be interposed between an insulation layer and a metal plug and an upper portion of the barrier layer can include metal nitride, and a lower portion of the barrier layer can comprise metal and metal nitride, to thereby minimize a loss of the barrier layer in a planarization process for forming the metal plug without deterioration of contact resistance between the metal plug and a substrate. Therefore, the metal plug can be prevented from being spaced apart from the insulation layer in a contact hole, and thus voids or gaps can be sufficiently prevented between the metal plug and a sidewall of the contact hole.

Although example embodiments in accordance with aspects of the present invention have been described, it is understood that the present invention should not be limited to these example embodiments; various changes and modifications can be made by one skilled in the art without departing from the spirit and scope of the present invention as hereinafter claimed. It is intended by the following claims to claim that which is literally described and all equivalents thereto, including all modifications and variations that fall within the scope of each claim.

What is claimed is:

1. A method of manufacturing a semiconductor device, comprising:
    forming an insulation layer on a substrate including various conductive structures, and planarizing the insulation layer;
    partially removing portions of the insulation layer to form at least one opening in the insulation layer, the substrate being partially exposed through the at least one opening;
    forming a barrier layer on a sidewall and bottom of the at least one opening, the barrier layer including a residual metal layer formed on the bottom and a lower portion of the sidewall of the at least one opening and a metal nitride layer formed on the residual metal layer and an upper sidewall of the at least one opening; and
    forming a metal plug in the at least one opening by filling up the at least one opening with a metal material,
    wherein forming the barrier layer includes:
        forming a metal layer on the sidewall and bottom of the at least one opening and on the upper surface of the insulation layer, the metal layer comprising a first conductive metal;
        forming the residual metal layer on the bottom and the lower portion of the sidewall of the at least one opening by partially removing the metal layer from the upper surface of the insulation layer and the upper portion of the sidewall of the at least one opening; and
        forming the metal nitride layer on the upper surface of the insulation layer, on the upper portion of the sidewall of the at least one opening, and on a surface of the residual metal layer, the metal nitride layer comprising a second conductive metal, and wherein forming the metal layer includes:
providing first reaction gases including the first conductive metal into a process chamber in which the substrate including the insulation layer and the at least one opening is positioned, so that a portion of the first reaction gases is chemisorbed onto the sidewall and bottom of the at least one opening and onto the upper surface of the insulation layer;

purging non-chemisorbed first reaction gases, which are not chemisorbed onto the sidewall and bottom of the at least one opening and onto the upper surface of the insulation layer, out of the process chamber by providing a purge gas into the process chamber; and depositing the first conductive metal onto the sidewall and bottom of the at least one opening and onto the upper surface of the insulation layer by providing second reaction gases into the process chamber.

2. The method of claim 1, wherein forming the insulation layer is performed by a chemical vapor deposition (CVD) process using a tetraethoxysilane (Si(OC2H5)4) gas and one of an oxygen (O2) gas and an ozone (O3) gas as a source gas.

3. The method of claim 1, wherein forming the at least one opening includes:
forming a mask pattern on the insulation layer in such a configuration that portions of the insulation layer corresponding to the at least one opening are exposed through the mask pattern; and
performing a dry etching process using the mask pattern as an etching mask.

4. The method of claim 1, wherein the first reaction gases includes at least one material selected from a group consisting of WF6, WC15, WBr6, WCo6, W(C2H2)6, W(PF3)6, W(allyl)4, (C2H5)WH2, [CH3(C5H4)2]2WH2, (C5H5)W(Co)3 (CH3), W(butadiene)3, W(methyl vinyl ketone)3, (C5H5)HW(Co)3, (C7H8)W(Co)3 and combinations thereof, and the second reaction gases includes at least one material selected from a group consisting of H2, Si2H6, B2H6, PH3, SiH4 and combinations thereof.

5. The method of claim 1, wherein the purge gas includes at least one material selected form a group consisting of helium (He), neon (Ne), argon (Ar), xenon (Xe) and nitrogen (N2).

6. The method of claim 1, wherein the metal layer is formed on the sidewall and bottom of the at least one opening and on the upper surface of the insulation layer to a thickness in a range of about 5 Å to about 200 Å.

7. The method of claim 1, wherein forming the metal plug includes:
depositing third conductive metal onto a surface of the metal nitride layer to a thickness sufficient to fill up the opening, thereby forming a plug metal layer on the metal nitride layer; and
performing a planarization process on the plug metal layer until the upper surface of the insulation layer is exposed, so that the plug metal layer and the metal nitride layer under the plug metal layer are partially removed from the upper surface of the insulation layer and remain in the at least one opening.

8. The method of claim 1, after forming the metal plug, further comprising:
forming an insulation interlayer on the insulation layer and on the metal plug;
forming a via hole passing through the insulation interlayer by partially removing the insulation interlayer, the metal plug being exposed through the via hole; and forming a conductive line with which the via hole is filled up and the metal plug is electrically connected.

9. The method of claim 2, wherein the CVD process includes a plasma-enhanced CVD (PECVD) process or a high-density plasma CVD (HDP-CVD) process.

10. The method of claim 7, wherein the third conductive metal includes tungsten (W).

11. The method of claim 8, wherein forming the via hole is performed by a damascene process and the conductive line comprises one of tungsten, aluminum (Al) and copper (Cu).

12. The method of claim 7, wherein the planarization process includes a chemical mechanical polishing (CMP) process.

13. A method of manufacturing a semiconductor device, comprising:
forming an insulation layer on a substrate including various conductive structures, and planarizing the insulation layer;
partially removing portions of the insulation layer to form at least one opening in the insulation layer, the substrate being partially exposed through the at least one opening;
forming a barrier layer on a sidewall and bottom of the at least one opening, the barrier layer including a residual metal layer formed on the bottom and a lower portion of the sidewall of the at least one opening and a metal nitride layer formed on the residual metal layer and an upper sidewall of the at least one opening; and
forming a metal plug in the at least one opening by filling up the at least one opening with a metal material,
wherein forming the barrier layer includes:
forming a metal layer on the sidewall and bottom of the at least one opening and on the upper surface of the insulation layer, the metal layer comprising a first conductive metal;
forming the residual metal layer on the bottom and the lower portion of the sidewall of the at least one opening by partially removing the metal layer from the upper surface of the insulation layer and the upper portion of the sidewall of the at least one opening; and
forming the metal nitride layer on the upper surface of the insulation layer, on the upper portion of the sidewall of the at least one opening, and on a surface of the residual metal layer, the metal nitride layer comprising a second conductive metal, and
wherein forming the residual metal layer includes:
generating a plasma in a process chamber in which the substrate including the insulation layer and the metal layer is positioned;
applying variable bias power in such a manner that the etching plasma is accelerated in a direction of the upper surface of the insulation layer and of the upper portion of the sidewall of the at least one opening at a higher rate than in a direction of the lower portion of the sidewall and the bottom of the at least one opening; and
partially removing the metal layer from the upper portion of the sidewall of the at least one opening and from the upper surface of the insulation layer using the etching plasma.

14. The method of claim 13, wherein generating the plasma includes:
providing a source gas into the process chamber; and
applying source power to the process chamber, thereby transforming the source gas into the plasma.

15. The method of claim 14, wherein the source gas for generating the plasma includes an etching source gas for etching the metal layer and a polymer gas for controlling an etching rate of the plasma relative to the metal layer.

16. The method of claim 14, wherein generating the plasma is performed at an internal pressure of the process chamber in a range of about 0.005 Torr to about 50 Torr and the source power in a range of about 10 W to about 3,000 W.

17. The method of claim 15, wherein the etching source gas includes one of chlorine (Cl2) gas and tetrafluoromethane (CF4) gas and the polymer gas includes one of trifluoromethane (CHF3) gas and boron trichloride (BCl3).

18. The method of claim 16, wherein the variable bias power includes a radio frequency (RF) bias power in a range of about 80 W to about 120 W.

19. A method of manufacturing a semiconductor device, comprising:
  forming an insulation layer on a substrate including various conductive structures, and planarizing the insulation layer;
  partially removing portions of the insulation layer at least one opening in the insulation layer, the substrate being partially exposed through the at least one opening;
  forming a barrier layer on a sidewall and bottom of the at least one opening, the barrier layer including a residual metal layer formed on the bottom and a lower portion of the sidewall of the at least one opening and a metal nitride layer formed on the residual metal layer and an upper sidewall of the at least one opening; and
  forming a metal plug in the at least one opening by filling up the at least one opening with a metal material,
  wherein forming the barrier layer includes:
    forming a metal layer on the sidewall and bottom of the at least one opening and on the upper surface of the insulation layer, the metal layer comprising a first conductive metal;
    forming the residual metal layer on the bottom and the lower portion of the sidewall of the at least one opening by partially removing the metal layer from the upper surface of the insulation layer and the upper portion of the sidewall of the at least one opening; and
    forming the metal nitride layer on the upper surface of the insulation layer, on the upper portion of the sidewall of the at least one opening, and on a surface of the residual metal layer, the metal nitride layer comprising a second conductive metal, and
  wherein forming the metal nitride layer includes:
    providing first reaction gases including the second conductive metal into a process chamber in which the substrate including the insulation layer and the residual metal layer is positioned, so that a portion of the first reaction gases is chemisorbed onto the upper portion of the sidewall, onto the upper surface of the insulation layer, and onto a surface of the residual metal layer;
    purging non-chemisorbed first reaction gases, which are not chemisorbed onto the upper portion of the sidewall, onto the upper surface of the insulation layer, and onto the surface of the residual metal layer, out of the process chamber by providing a first purge gas into the process chamber;
    depositing the second conductive metal onto the upper portion of the sidewall, onto the upper surface of the insulation layer, and onto the surface of the residual metal layer by providing second reaction gases into the process chamber, thereby forming a temporary metal layer on the upper portion of the sidewall, on the upper surface of the insulation layer, and on the surface of the residual metal layer;
    purging non-chemisorbed second reaction gases, which are not chemisorbed onto the upper portion of the sidewall, onto the upper surface of the insulation layer and onto the surface of the residual metal layer, and byproducts caused by a chemical reaction of the first and second reaction gases out of the process chamber by providing a second purge gas into the process chamber; and
    nitrating the temporary metal layer by providing third reaction gases including nitrogen (N).

20. The method of claim 19, wherein the first reaction gases include at least one material selected from a group consisting of WF6, WCl5, WBr6, WCo6, W(C2H2)6, W(PF3)6, W(allyl)4, (C2H5)WH2, [CH3(C5H4)2]2WH2, (C5H5)W(Co)3 (CH3), W(butadiene)3, W(methyl vinyl ketone)3, (C5H5)HW(Co)3, (C7H8)W(Co)3 and combinations thereof, the second reaction gases include at least one material selected from a group consisting of H2, Si2H6, B2H6, PH3, SiH4 and combinations thereof, and a third reaction gases includes one of nitrogen gas and ammonium (NH3) gas.

21. The method of claim 19, wherein the temporary metal layer is formed to a thickness in a range of about 20 Å to about 400 Å.

* * * * *